(12) United States Patent
Kim

(10) Patent No.: US 12,261,181 B2
(45) Date of Patent: *Mar. 25, 2025

(54) SEMICONDUCTOR PACKAGE INCLUDING IMAGE SENSOR CHIP, TRANSPARENT SUBSTRATE, AND JOINING STRUCTURE

(71) Applicant: SAMSUNG ELECTRONICS CO., LTD., Suwon-si (KR)

(72) Inventor: Woonbae Kim, Seoul (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/167,972

(22) Filed: Feb. 13, 2023

(65) Prior Publication Data

US 2023/0197747 A1  Jun. 22, 2023

Related U.S. Application Data

(63) Continuation of application No. 16/830,710, filed on Mar. 26, 2020, now Pat. No. 11,581,348.

(30) Foreign Application Priority Data

Aug. 14, 2019 (KR) .................. 10-2019-0099478

(51) Int. Cl.
*H01L 27/146* (2006.01)
*H01L 23/00* (2006.01)
(Continued)

(52) U.S. Cl.
CPC ...... *H01L 27/14621* (2013.01); *H01L 23/481* (2013.01); *H01L 23/49822* (2013.01);
(Continued)

(58) Field of Classification Search
CPC ...................................... H01L 24/06
See application file for complete search history.

(56) References Cited

U.S. PATENT DOCUMENTS 7,408,257 B2  8/2008  Jung et al.
7,570,297 B2  8/2009  Maeda et al.
(Continued)

FOREIGN PATENT DOCUMENTS

CN  109155829 A  1/2019
JP  2004063753 A  * 2/2004
(Continued)

*Primary Examiner* — Jennifer D Bennett
*Assistant Examiner* — Erin R Garber
(74) *Attorney, Agent, or Firm* — Myers Bigel, P.A.

(57) ABSTRACT

A semiconductor package may include an image sensor chip, a transparent substrate spaced apart from the image sensor chip, a joining structure in contact with a top surface of the image sensor chip and a bottom surface of the transparent substrate, on an edge region of the top surface of the image sensor chip, and a circuit substrate electrically connected to the image sensor chip. The image sensor chip may include a penetration electrode which penetrates at least a portion of an internal portion of the image sensor chip, and a terminal pad, which is on the edge region of the top surface of the image sensor chip and is electrically connected to the penetration electrode. The joining structure may include a spacer and an adhesive layer. The joining structure may overlap the terminal pad. The spacer is between the transparent substrate and the terminal pad.

20 Claims, 14 Drawing Sheets

(51) Int. Cl.
*H01L 23/48* (2006.01)
*H01L 23/498* (2006.01)
*H01L 23/58* (2006.01)
*H01L 23/02* (2006.01)

(52) U.S. Cl.
CPC ........ *H01L 23/49827* (2013.01); *H01L 23/58* (2013.01); *H01L 24/06* (2013.01); *H01L 27/14603* (2013.01); *H01L 27/14618* (2013.01); *H01L 27/14625* (2013.01); *H01L 27/14627* (2013.01); *H01L 27/14634* (2013.01); *H01L 27/14636* (2013.01); *H01L 23/02* (2013.01); *H01L 27/1462* (2013.01)

(56) References Cited

U.S. PATENT DOCUMENTS

| | | | |
|---|---|---|---|
| 7,589,422 B2 * | 9/2009 | Lee | H01L 24/05 257/734 |
| 8,368,096 B2 | 2/2013 | Asano et al. | |
| 8,913,034 B2 | 12/2014 | Wang | |
| 9,400,911 B2 | 7/2016 | Erhart et al. | |
| 10,659,707 B2 | 5/2020 | Oka et al. | |
| 11,581,348 B2 * | 2/2023 | Kim | H01L 23/58 |
| 2004/0077121 A1 * | 4/2004 | Maeda | H01L 27/14625 257/E27.15 |
| 2005/0104186 A1 | 5/2005 | Yang et al. | |
| 2010/0182498 A1 * | 7/2010 | Niwa | 348/374 |
| 2011/0080516 A1 | 4/2011 | Yi et al. | |
| 2015/0187707 A1 | 7/2015 | Lee et al. | |
| 2018/0308890 A1 | 10/2018 | Wang et al. | |
| 2019/0081187 A1 * | 3/2019 | Balimann | G03B 43/00 |
| 2019/0189601 A1 * | 6/2019 | Kayashima | H01L 23/367 |

FOREIGN PATENT DOCUMENTS

| | | |
|---|---|---|
| JP | 4802907 B2 | 10/2011 |
| JP | 2019029979 A | 2/2019 |
| KR | 20050120359 A | 12/2005 |
| KR | 100609121 B1 | 8/2006 |
| KR | 20190015201 A | 2/2019 |
| WO | WO-2019026717 A1 * | 2/2019 |

* cited by examiner

SEMICONDUCTOR PACKAGE INCLUDING IMAGE SENSOR CHIP, TRANSPARENT SUBSTRATE, AND JOINING STRUCTURE

CROSS-REFERENCE TO RELATED APPLICATIONS

This application is a continuation of U.S. patent application Ser. No. 16/830,710 filed Mar. 26, 2020 which application claims priority under 35 U.S.C. § 119 to Korean Patent Application No. 10-2019-0099478, filed on Aug. 14, 2019, in the Korean Intellectual Property Office, the entire contents of each are hereby incorporated by reference.

BACKGROUND OF THE INVENTION

The present disclosure relates to a semiconductor package, and in particular, to a semiconductor package including an image sensor chip.

An image sensor, such as a charge-coupled device (CCD) sensor or a complementary metal-oxide-semiconductor image sensor (CIS), is applied to various electronic products, such as mobile phones, digital cameras, optical mice, security cameras, and/or biometric devices. Due to an increasing demand for small and multifunctional electronic products, a semiconductor package including an image sensor may need to have improved technical properties (e.g., small size, high density, low power consumption, multifunction, high signal-processing speed, high reliability, low cost, and/or clear image quality). Research is being conducted to realize such technical properties of the semiconductor package.

SUMMARY

Some embodiments of the inventive concept provide a small-sized semiconductor package.

Some embodiments of the inventive concept provide a highly-reliable semiconductor package.

According to some embodiments of the inventive concept, a semiconductor package may include an image sensor chip, a transparent substrate spaced apart from the image sensor chip, a joining structure in contact with a top surface of the image sensor chip and a bottom surface of the transparent substrate, on an edge region of the top surface of the image sensor chip, and a circuit substrate electrically connected to the image sensor chip. The image sensor chip may include a penetration electrode, which penetrates at least a portion of an internal portion of the image sensor chip, and a terminal pad, which is on the edge region of the top surface of the image sensor chip and is connected to the penetration electrode. The joining structure may the terminal pad.

According to some embodiments of the inventive concept, a semiconductor package may include an image sensor chip including a pixel region, and a peripheral region, which encloses the pixel region in plan view. A micro lens and a color filter may be on the image sensor chip. The semiconductor package may include a transparent substrate on the image sensor chip, a joining structure in the peripheral region that connects the image sensor chip to the transparent substrate, a circuit substrate electrically connected to the image sensor chip, an insulating layer between the image sensor chip and the circuit substrate, and a reinforcing substrate, which is in contact with a bottom surface of the circuit substrate and is overlapped with at least the pixel region in a vertical direction that is substantially perpendicular to the image sensor chip. The joining structure may include a spacer and an adhesive layer, which is between the spacer and the image sensor chip.

According to some embodiments of the inventive concept, a semiconductor package may include a transparent substrate including an infrared light cut filter, a circuit substrate spaced apart from the transparent substrate in a first direction perpendicular to a bottom surface of the transparent substrate, an image sensor chip between the transparent substrate and the circuit substrate, the image sensor chip including a micro lens array and a color filter array on a center region of a top surface thereof, a terminal pad on an edge region of the top surface of the image sensor chip, a penetration electrode that penetrates the image sensor chip and is connected to the terminal pad, a connection structure that electrically connects the penetration electrode to the circuit substrate, and a joining structure on the edge region of the top surface of the image sensor chip and in contact with the bottom surface of the transparent substrate and the top surface of the image sensor chip. The joining structure may include a spacer and an adhesive layer, which is between the image sensor chip or the transparent substrate and the spacer. A width of the joining structure in a second direction perpendicular to the first direction may be larger than a width of the terminal pad in the second direction.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

It should be noted that these figures are intended to illustrate the general characteristics of methods, structure and/or materials utilized in certain example embodiments and to supplement the written description provided below. These drawings, however, may not necessarily be to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown.

Figure 1:
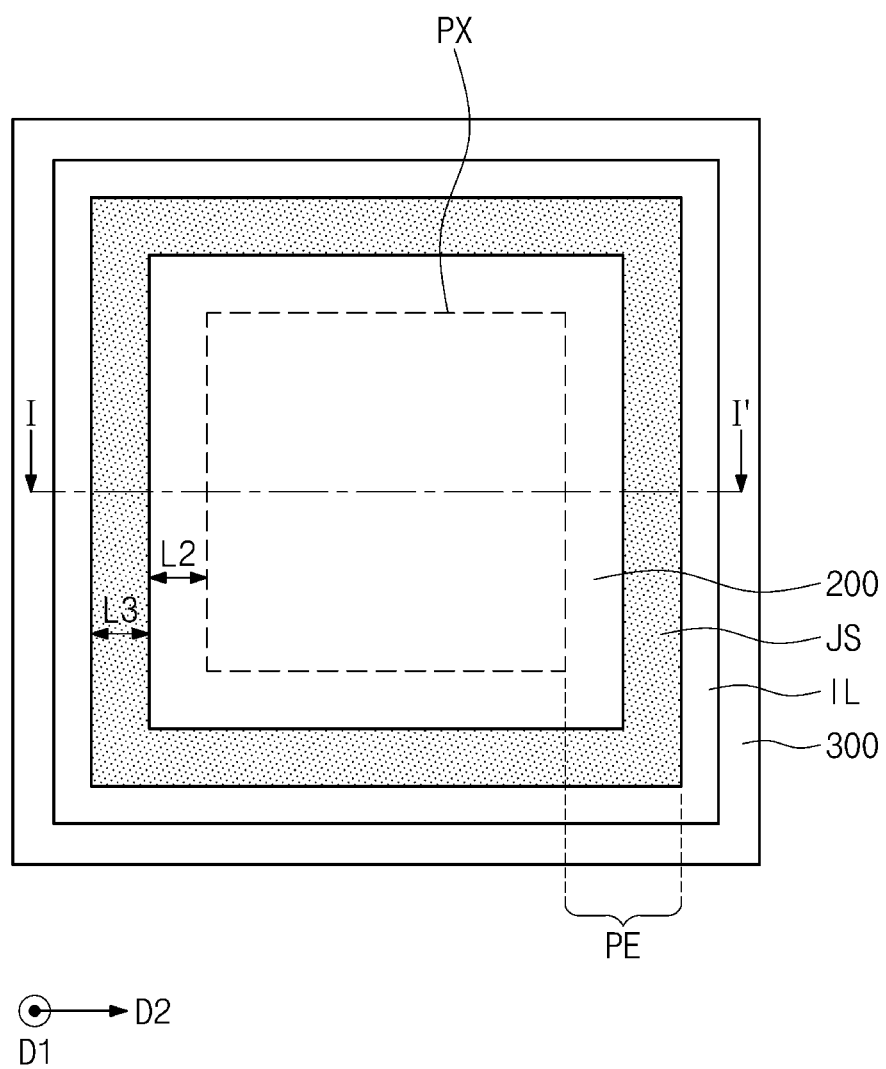
FIG. 1 is a plan view schematically illustrating a semiconductor package according to some embodiments of the inventive concept.
Figure 2:
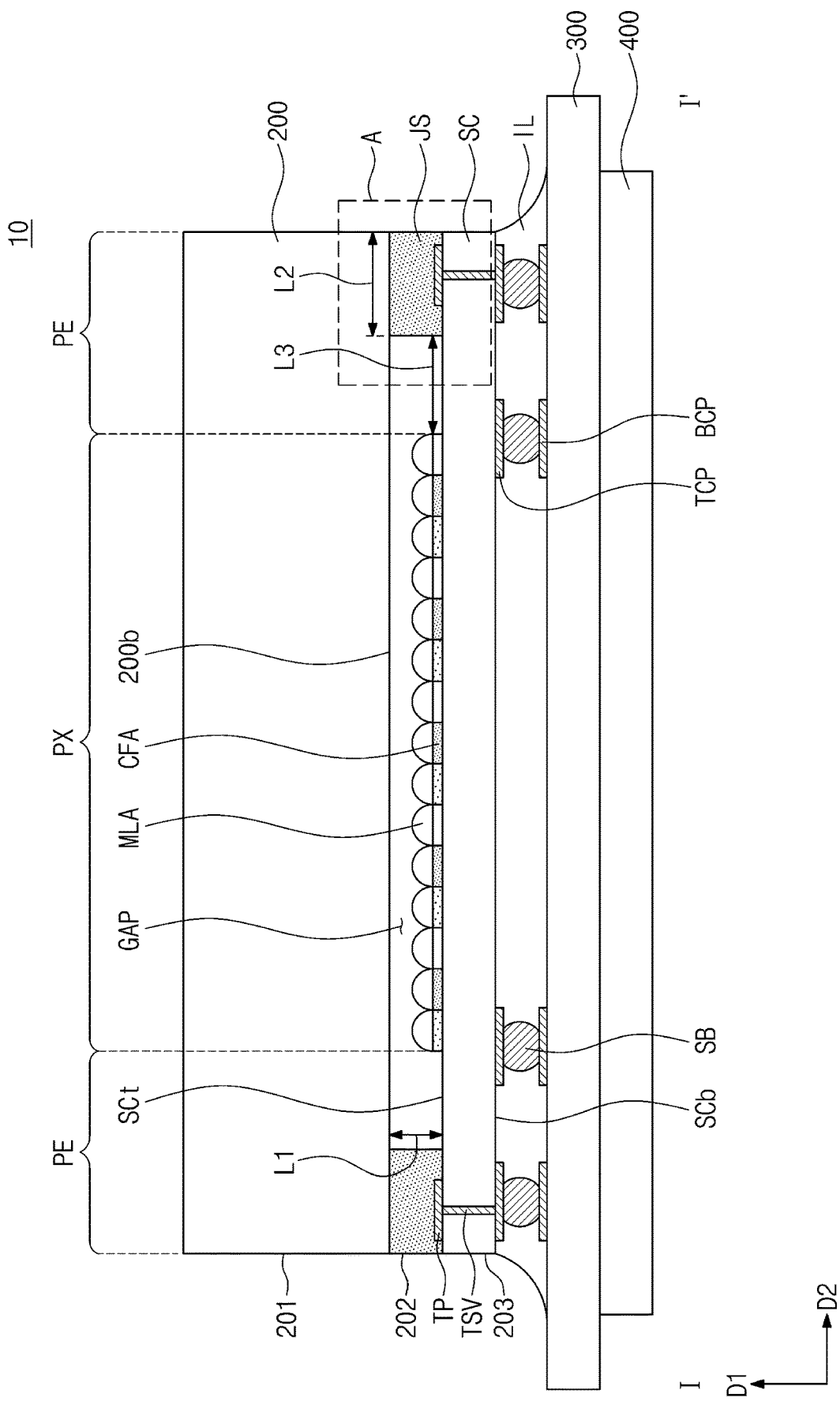
FIGS. 2 to 5 are sectional views, which are taken along a line I-I' of FIG. 1, and each of which illustrates a semiconductor package according to some embodiments of the inventive concept.

FIG. 1 is a plan view schematically illustrating a semiconductor package according to some embodiments of the inventive concept. FIG. 2 is a sectional view, which is taken along a line I-I' of FIG. 1 to illustrate a semiconductor package according to some embodiments of the inventive concept.

Referring to FIGS. 1 and 2, a semiconductor package 10 according to some embodiments of the inventive concept may include an image sensor chip SC, a transparent substrate 200 provided on the image sensor chip SC, and a circuit substrate 300 electrically connected to the image sensor chip SC. The image sensor chip SC, the transparent substrate 200, and the circuit substrate 300 may be disposed parallel to a plane perpendicular to a first direction D1. When viewed in a sectional view, the image sensor chip SC and the transparent substrate 200 each may have substantially the same width in a second direction D2 perpendicular to the first direction D1. The circuit substrate 300 may have a width that is larger than the width of the image sensor chip SC and/or the transparent substrate 200, when measured in the second direction D2.

The image sensor chip SC may include a first surface SCt and a second surface SCb that are opposite to each other. The first surface SCt and the second surface SCb may be planes that are parallel to each other. The first surface SCt and the second surface SCb may be planes that are perpendicular to the first direction D1. The first surface SCt may include a pixel region PX and a peripheral region PE enclosing the pixel region PX. A micro lens array MLA may be provided on the pixel region PX of the first surface SCt. The micro lens array MLA may include a plurality of semi-spherical micro lenses. A color filter array CFA may be provided between the micro lens array MLA and the image sensor chip SC. The color filter array CFA may include a plurality of color filters. For example, the color filter array CFA may have a structure, in which a red color filter, a blue color filter, and two green color filters are disposed in one unit area, a structure, in which respective color filters are disposed to form a 2×2 arrangement, and/or a structure, in which respective color filters are disposed to form a 3×3 arrangement. The micro lenses of the micro lens array MLA and the color filters of the color filter array CFA may be arranged on a plane that is perpendicular to the first direction D1.

In some embodiments, the image sensor chip SC may include a penetration electrode or through-silicon via TSV. The penetration electrode TSV may be provided to be overlapped with the peripheral region PE. The penetration electrode TSV may be provided parallel to the first direction D1. The penetration electrode TSV may be provided to penetrate at least a portion of the image sensor chip SC. The penetration electrode TSV may be formed of or include at least one of metallic materials (e.g., copper (Cu), aluminum (Al), and/or tungsten (W)). The penetration electrode TSV may be electrically connected to a terminal pad TP on the first surface SCt and a top conductive pad TCP on the second surface SCb. Although two penetration electrodes TSV are illustrated in FIGS. 2 to 5, the number of the penetration electrodes TSV, which are extended from the top conductive pad TCP to penetrate at least a portion of the image sensor chip SC, may be greater than two.

Although not shown, the image sensor chip SC may further include a logic chip. The logic chip may include circuits, which are used to operate the image sensor chip SC. In some embodiments, the image sensor chip SC may include a structure, in which a doped semiconductor layer and an insulating layer are stacked. A plurality of electrodes and a plurality of plugs may be provided in the insulating layer. In addition, the image sensor chip SC may include pixels, which are located directly below the first surface SCt and are disposed to face the color filters. The pixels may be provided in the pixel region PX. The pixels may be separated from each other by device isolation layers. The device isolation layers may have a grid shape. Each of the pixels may include a photoelectric conversion part provided therein. The photoelectric conversion part may be doped to have a different conductivity type from that of the semiconductor layer adjacent thereto. In addition, a protection layer and/or a fixed charge layer may be further provided on the first surface SCt of the image sensor chip SC.

The transparent substrate 200 may be disposed adjacent to the first surface SCt of the image sensor chip SC. A bottom surface 200b of the transparent substrate 200 may be parallel to the first surface SCt of the image sensor chip SC. The transparent substrate 200 may be formed of or include a transparent polymer material (e.g., acryl) or glass. The transparent substrate 200 may include an infrared light (IR) cut filter. The IR cut filter may include a plurality of alternately-deposited materials having different refractive indices. The transparent substrate 200 may block an infrared light signal, and thus, it may be possible to improve clearness of the image.

A joining structure JS may be provided between the image sensor chip SC and the transparent substrate 200. The joining structure JS may be formed of or include an insulating material. The joining structure JS may be formed of or include at least one of, for example, epoxy resin, polyimide, and/or photoresist. The joining structure JS may prevent light, which is reflected or re-reflected by the peripheral region PE, from being incident into the pixel region PX. The joining structure JS may be provided along an edge of the image sensor chip SC and may have a closed-loop shape. In other words, the joining structure JS may be provided to be overlapped with the peripheral region PE. Due to the joining structure JS, a cavity GAP may be formed between the transparent substrate 200 and the image sensor chip SC. The cavity GAP may be blocked from the outside by the joining structure JS. In other words, the joining structure JS may prevent external moisture or a contamination material from entering the cavity GAP. In addition, the joining structure JS may suppress or prevent the image sensor chip SC from being affected by a change in temperature of a neighboring region.

The joining structure JS may be in contact with the first surface SCt of the image sensor chip SC and the bottom surface 200b of the transparent substrate 200. A height of the joining structure JS in the first direction D1 may be uniform. The joining structure JS may have a first length L1 in the first direction D1. The joining structure JS may have a second length L2 in the second direction D2. The first length L1 may range, for example, from about 10 μm to 150 μm. The second length L2 may range, for example, from about 30 μm to 450 μm. The bottom surface 200b of the transparent substrate 200 may be spaced apart from the first surface SCt of the image sensor chip SC by the first length L1. The bottom surface 200b of the transparent substrate 200 may be sufficiently spaced apart from the first surface SCt of the image sensor chip SC, and thus, it may be possible to suppress the distortion of images, which is caused by a contamination material on the transparent substrate 200. The first length L1 may be larger than a sum of heights of the micro lens array MLA and the color filter array CFA in the first direction D1. Accordingly, the transparent substrate 200 may be spaced apart from the micro lens array MLA. In addition, the cavity GAP may be formed on the pixel region PX.

The joining structure JS may be spaced apart from the micro lens array MLA and the color filter array CFA in the second direction D2. When viewed in a section taken along a line I-I' of FIG. 1, the joining structure JS may be spaced apart from the micro lens array MLA and the color filter array CFA by a third length L3 in the second direction D2. In some embodiments, the third length L3 may range from about 20 μm to 300 μm. The smaller the second length L2 and the third length L3, the smaller the area of the peripheral region PE. In other words, the smaller the second length L2 and the third length L3, the smaller the size of the semiconductor package 10. In addition, a portion of an outer side surface 202 of the joining structure JS may be aligned to a side surface 201 of the transparent substrate 200 and a side surface 203 of the image sensor chip SC. Since the portion of the outer side surface 202 of the joining structure JS, the side surface 201 of the transparent substrate 200, and the side surface 203 of the image sensor chip SC are aligned to each other, an area of the peripheral region PE may be reduced.

The circuit substrate 300 may be disposed adjacent to the second surface SCb of the image sensor chip SC. The circuit substrate 300 may be provided in the form of a flexible thin film. A thickness of the circuit substrate 300 in the first direction D1 may be smaller than a thickness of the image sensor chip SC in the first direction D1. The circuit substrate 300 may be for example, a chip on film (COF) substrate or a flexible printed circuit board (FPCB). The top conductive pad TCP, a bottom conductive pad BCP, and a solder ball SB may be provided between the circuit substrate 300 and the image sensor chip SC. The top conductive pad TCP, the bottom conductive pad BCP, and the solder ball SB may be formed of or include at least one of metallic materials. The top conductive pad TCP may be in contact with the second surface SCb of the image sensor chip SC, the penetration electrode TSV, and the solder ball SB. The bottom conductive pad BCP may be in contact with a top surface of the circuit substrate 300 and the solder ball SB. The solder ball SB may be in contact with the top conductive pad TCP and the bottom conductive pad BCP. The top conductive pad TCP, the bottom conductive pad BCP, and the solder ball SB may be provided in the peripheral region PE and/or the pixel region PX. The image sensor chip SC and the circuit substrate 300 may be electrically connected to each other through the top conductive pad TCP, the bottom conductive pad BCP, and the solder ball SB.

An insulating layer IL may be provided between the circuit substrate 300 and the image sensor chip SC. The insulating layer IL may enclose or encapsulate the top conductive pad TCP, the bottom conductive pad BCP, and the solder ball SB. The insulating layer IL may be formed of or include, for example, an epoxy resin. The insulating layer IL may have a single- or multi-layered structure. A width of the insulating layer IL in the second direction D2 may increase in a direction from the image sensor chip SC toward the circuit substrate 300. In other words, a side surface of the insulating layer IL may be inclined at an angle to the second surface SCb of the image sensor chip SC. The side surface of the insulating layer IL may be a curved surface, according to some embodiments.

A reinforcing substrate 400 may be provided on a bottom surface of the circuit substrate 300 to support the circuit substrate 300. The reinforcing substrate 400 may support the circuit substrate 300 having a flexible property through the bottom surface of the circuit substrate 300. The reinforcing substrate 400 may be formed of or include, for example, stainless use steel (SUS). The reinforcing substrate 400 may be overlapped with the pixel region PX and the peripheral region PE in the first direction D1 and may be extended in the second direction D2. The reinforcing substrate 400 may protect the pixel region PX of the image sensor chip SC from an external impact. The reinforcing substrate 400 may contribute to increase an overall structural stability of the semiconductor package 10.

In the semiconductor package 10 according to some embodiments of the inventive concept, a pad for a wire bonding may not be disposed on the first surface SCt of the image sensor chip SC. The image sensor chip SC and the circuit substrate 300 may be connected to each other in a flip-chip bonding manner using the penetration electrode TSV and the solder ball SB, instead of the pad for the wire bonding. Accordingly, the transparent substrate 200 may be attached to the image sensor chip SC, and an additional space for a wire bonding may not be needed. In more detail, the transparent substrate 200 may be directly attached to the image sensor chip SC, and thus, the first length L1 may be reduced. In addition, the additional space for the wire bonding may not be needed, and thus, the second length L2 and the third length L3 may be reduced. This may make it possible to reduce a total height and an area of the semiconductor package 10.

Figure 3:
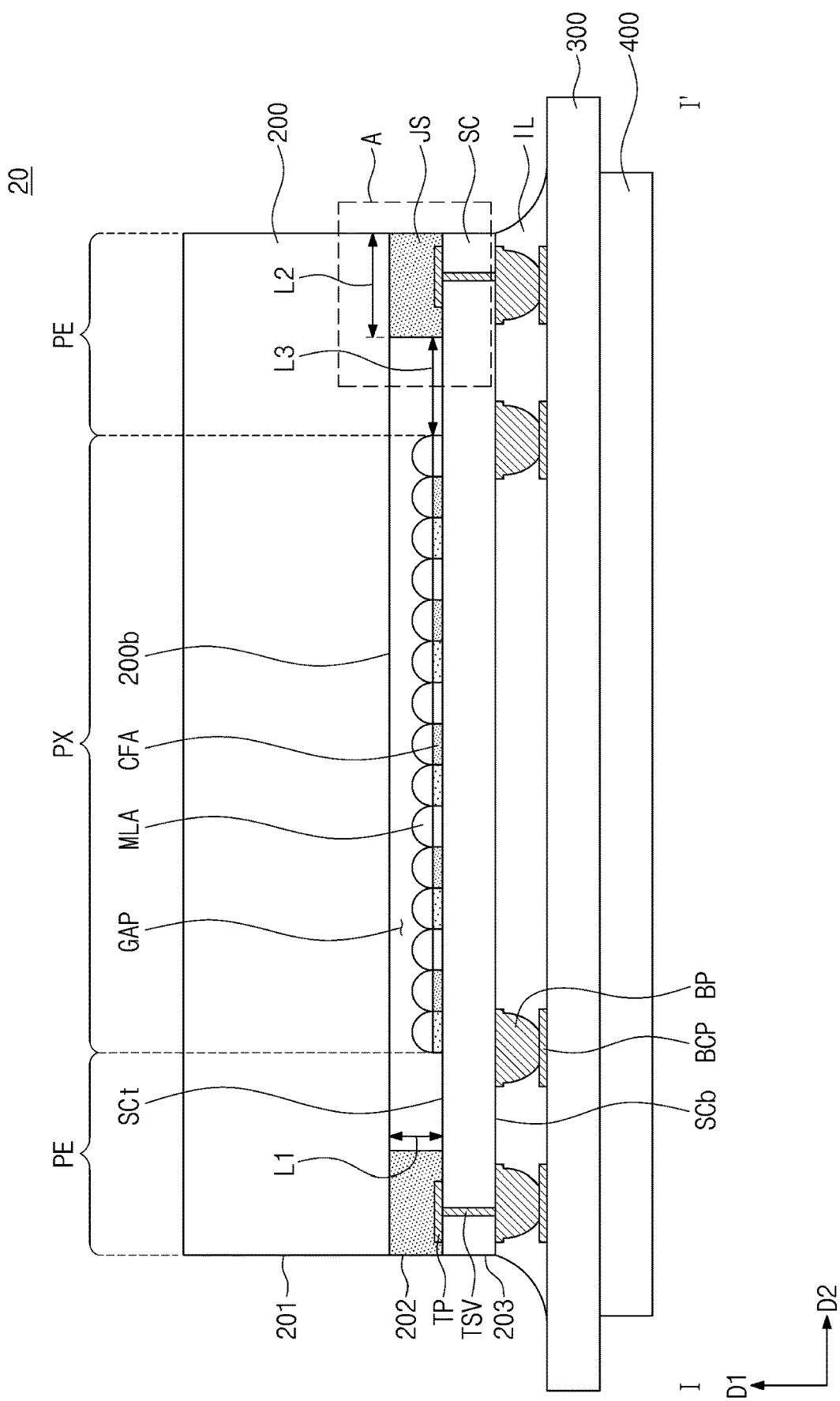

FIG. 3 is a sectional view, which is taken along a line I-I' of FIG. 1 to illustrate a semiconductor package according to some embodiments of the inventive concept.

Referring to FIG. 3, a semiconductor package 20 according to some embodiments of the inventive concept may include a conductive bump BP, instead of the top conductive pad TCP and the solder ball SB of FIG. 2. For concise description, an element previously described with reference to FIGS. 1 and 2 may be identified by a similar or identical reference number without repeating an overlapping description thereof.

The conductive bump BP may be in contact with the second surface SCb of the image sensor chip SC and the bottom conductive pad BCP. In other words, the conductive bump BP may electrically connect the image sensor chip SC to the circuit substrate 300. The conductive bump BP may have a top surface that is coplanar with the second surface SCb of the image sensor chip SC. A width of the conductive bump BP in the second direction D2 may be increased in the first direction D1. The conductive bump BP may be formed of or include at least one of metallic materials. For example, the conductive bump BP may include gold (Au).

Figure 4:
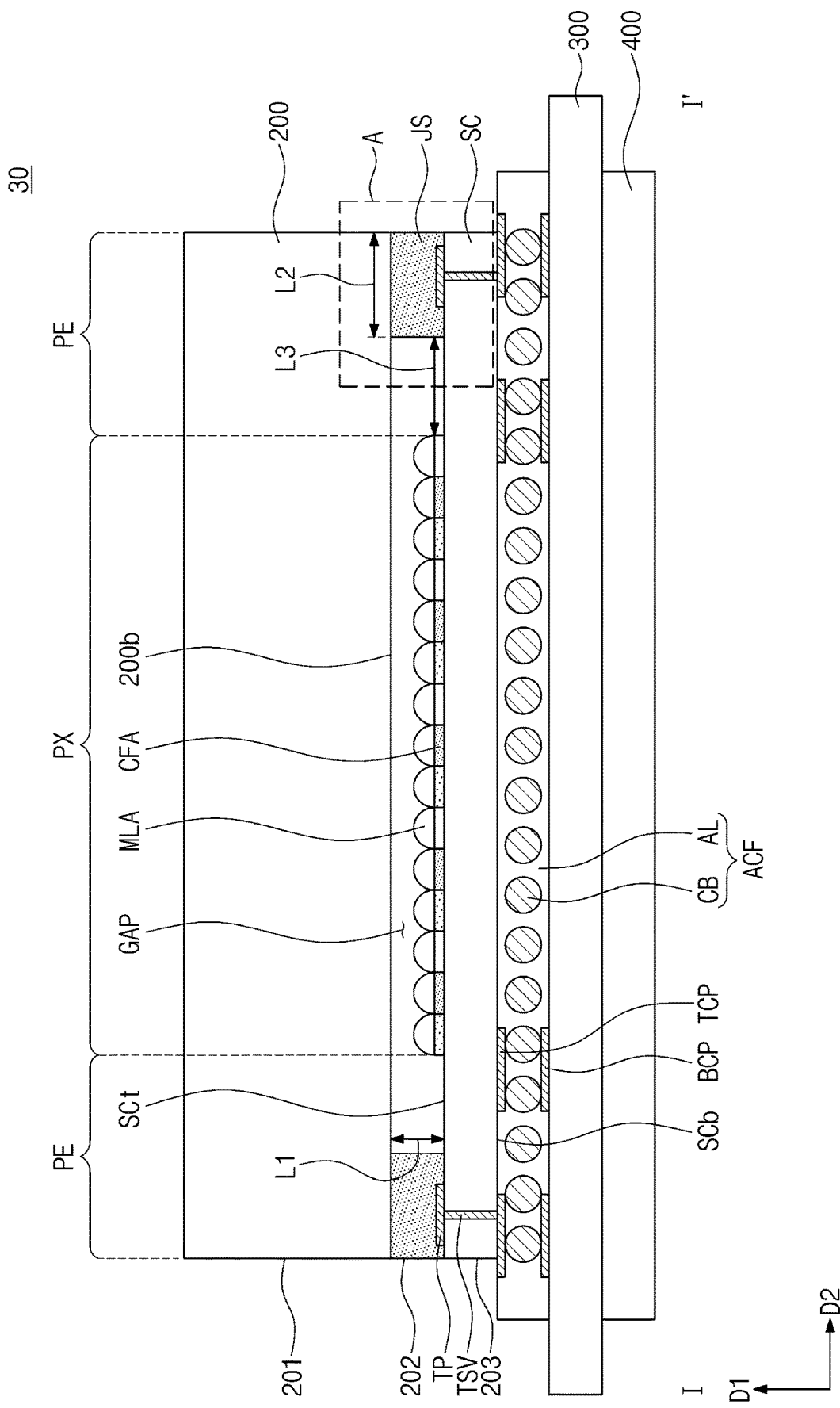

FIG. 4 is a sectional view, which is taken along a line I-I' of FIG. 1 to illustrate a semiconductor package according to some embodiments of the inventive concept.

Referring to FIG. 4, a semiconductor package 30 according to some embodiments of the inventive concept may include an anisotropic conductive film ACF, instead of the solder ball SB and the insulating layer IL of FIG. 2 or instead of the conductive bump BP of FIG. 3. For concise description, an element previously described with reference to FIGS. 1 and 2 may be identified by a similar or identical reference number without repeating an overlapping description thereof.

The anisotropic conductive film ACF may be provided between the image sensor chip SC and the circuit substrate 300. The anisotropic conductive film ACF may include a plurality of conductive particles CB and an insulating resin AL, in which the conductive particles CB are provided. Each of the conductive particles CB may be shaped like a circular or elliptical ball. Although not shown, a thin insulating layer may be further provided to cover or overlap the conductive particles CB. The conductive particles CB may be non-uniformly dispersed in the insulating resin AL. The conductive particles CB may be formed of or include at least one of, for example, carbon, nickel (Ni), or nickel-gold alloy (Ni/Au). The conductive particles CB may be formed of or include a lead-free or environment-friendly material. The insulating resin AL may be formed of or include at least one of, for example, styrene butadiene rubber (SBR), polyvinyl butylene, polyurethane, acrylic resin, or epoxy resin. When heat or pressure is applied to the anisotropic conductive film ACF, the thin insulating layer of the conductive particles CB may be broken. Accordingly, the anisotropic conductive film ACF may electrically connect the top conductive pad TCP to the bottom conductive pad BCP. In other words, the anisotropic conductive film ACF may electrically connect the image sensor chip SC to the circuit substrate 300.

In some embodiments, although not shown, a non-conductive film (NCF) may be provided, instead of the anisotropic conductive film ACF. The non-conductive film may not include the conductive particles CB. The non-conductive film may include a conductive bump that is in contact with the top conductive pad TCP. The conductive bump may be in contact with the bottom conductive pad BCP, if heat or pressure is applied thereto. Accordingly, the non-conductive film may electrically connect the top conductive pad TCP to the bottom conductive pad BCP. In other words, the non-conductive film may electrically connect the image sensor chip SC to the circuit substrate 300.

Figure 5:
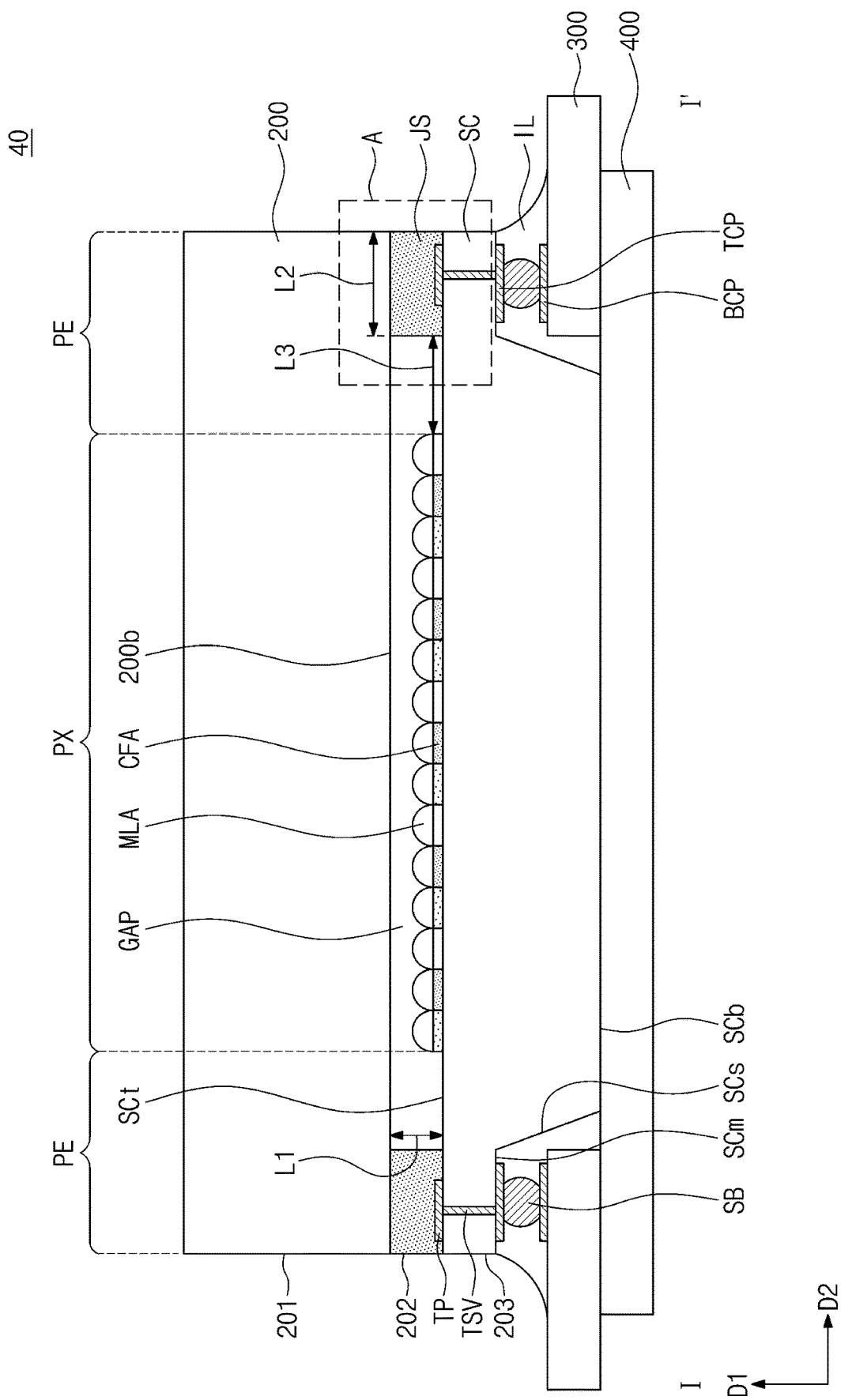

FIG. 5 is a sectional view, which is taken along a line I-I' of FIG. 1 to illustrate a semiconductor package according to some embodiments of the inventive concept.

Referring to FIG. 5, a semiconductor package 40 according to some embodiments of the inventive concept may include the image sensor chip SC having a stepwise structure. For concise description, an element previously described with reference to FIGS. 1 and 2 may be identified by a similar or identical reference number without repeating an overlapping description thereof.

The image sensor chip SC may include a protruding portion, which protrudes in a direction opposite to the first direction D1. The protruding portion may be provided in the pixel region PX. In other words, a thickness of the image sensor chip SC may be larger in the pixel region PX than in the peripheral region PE. A side surface of the protruding portion of the image sensor chip SC may be inclined at an angle to the first surface SCt of the image sensor chip SC. The circuit substrate 300 may have an opening, and a portion of the protruding portion may be provided in the opening. The protruding portion may be spaced apart from the circuit substrate 300. The protruding portion may be in contact with the reinforcing substrate 400.

In more detail, the image sensor chip SC may include the first surface SCt and the second surface SCb, which are opposite to each other, a third surface SCm between the first surface SCt and the second surface SCb, and an inclined surface SCs connecting the second surface SCb to the third surface SCm. The first surface SCt, the second surface SCb, and the third surface SCm may be flat surfaces that are perpendicular to the first direction D1. By contrast, the inclined surface SCs may be a flat surface that is inclined at an angle to the first direction D1 between the third surface SCm and the second surface SCb. The second surface SCb, the third surface SCm, and the inclined surface SCs may be connected to form a stepwise structure. The image sensor chip SC having the stepwise structure may be formed by an anisotropic etching process. The image sensor chip SC having the stepwise structure may be thickly formed between the transparent substrate 200 and the reinforcing substrate 400. Accordingly, the structural stability of the image sensor chip SC may be improved.

The second surface SCb may be in contact with the reinforcing substrate 400. In more detail, the second surface SCb may be coplanar with the top surface of the reinforcing substrate 400 and the bottom surface of the circuit substrate 300. The third surface SCm may be provided between the circuit substrate 300 and the first surface SCt. In more detail, the third surface SCm may be coplanar with the bottom surface of the penetration electrode TSV and the top surface of the top conductive pad TCP. A width of the image sensor chip SC in the second direction D2 may increase in a direction from the second surface SCb toward the third surface SCm. The width of the image sensor chip SC in the second direction D2 may be uniform from the third surface SCm to the first surface SCt.

The circuit substrate 300 may be provided along an edge region of the image sensor chip SC. The circuit substrate 300 may be spaced apart from the inclined surface SCs of the image sensor chip SC. The circuit substrate 300 may not be provided in the pixel region PX and a portion of the peripheral region PE. The top conductive pad TCP, the bottom conductive pad BCP, and the solder ball SB may be provided on the circuit substrate 300 spaced apart from the inclined surface SCs. In other words, the circuit substrate 300 and the image sensor chip SC may be electrically connected to each other at a region spaced apart from the inclined surface SCs. When compared with the structures of FIGS. 2 to 4, the thickness of the image sensor chip SC in the first direction D1 may be increased, but the total height of the semiconductor package 40 in the first direction D1 may not be increased.

FIGS. 6 to 10 are enlarged sectional views illustrating a portion 'A' shown in FIGS. 2 to 5, respectively.

The joining structure JS may include an adhesive layer 530 and one or more spacers 510 and 520. The spacers 510 and 520 may be formed of or include at least one of, for example, polyimide or photoresist. As an example, the spacers 510 and 520 may include a dry film photoresist (DFR). The spacers 510 and 520 may be formed of or include substantially the same material. The adhesive layer 530 may be formed of or include at least one of epoxy resin or other adhesive materials. The epoxy resin may be, for example, a b-stage epoxy resin. The adhesive layer 530 may become fluidic, when heat or pressure is applied thereto.

Figure 6:
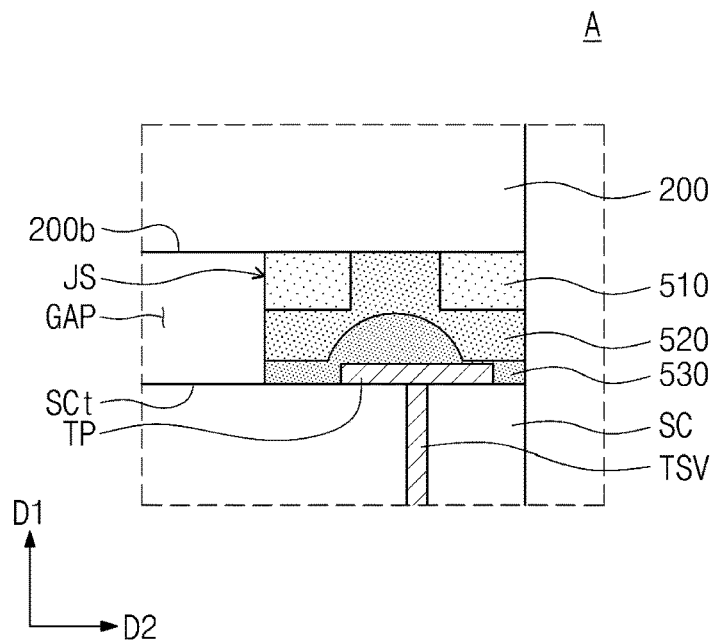
FIGS. 6 to 10 are enlarged sectional views illustrating a portion 'A' shown in FIGS. 2 to 5.

Referring to FIG. 6, the joining structure JS on the first surface SCt of the image sensor chip SC may include first and second spacers 510 and 520 and the adhesive layer 530. The first spacer 510 may be in contact with the bottom surface 200b of the transparent substrate 200. The first spacer 510 may include at least two patterns. The patterns of the first spacer 510 may be spaced apart from each other in the second direction D2. The second spacer 520 may be provided between the first spacer 510 and the first surface SCt of the image sensor chip SC. The second spacer 520 may fill a gap region between the separated patterns of the first spacer 510. A portion of a bottom surface of the second spacer 520 may have a concave shape, according to some embodiments. The adhesive layer 530 may be disposed between and attached to the first surface SCt of the image sensor chip SC and the second spacer 520. A portion of a top surface of the adhesive layer 530 may have a convex shape that is fittingly engaged with the concave portion of the bottom surface of the second spacer 520. The adhesive layer 530 may cover the terminal pad TP on the first surface SCt of the image sensor chip SC. A width of each of the first and second spacers 510 and 520 and the adhesive layer 530 in the second direction D2 may be larger than a width of the terminal pad TP in the second direction D2.

Figure 7:
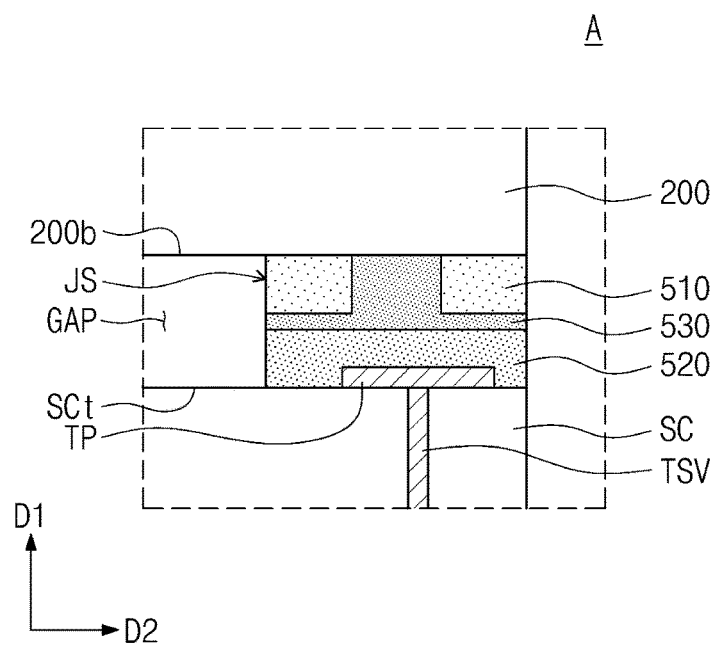

Referring to FIG. 7, the adhesive layer 530 may be disposed between and attached to the first and second spacers 510 and 520. The adhesive layer 530 may fill a gap region between the separated patterns of the first spacer 510. The second spacer 520 may be provided between the adhesive layer 530 and the first surface SCt of the image sensor chip SC. A top surface of the second spacer 520 may be parallel to the first surface SCt of the image sensor chip SC. The second spacer 520 may cover or overlap the terminal pad TP on the first surface SCt of the image sensor chip SC. For concise description, overlapping description of elements previously described with reference to FIG. 6 may be omitted.

Figure 8:
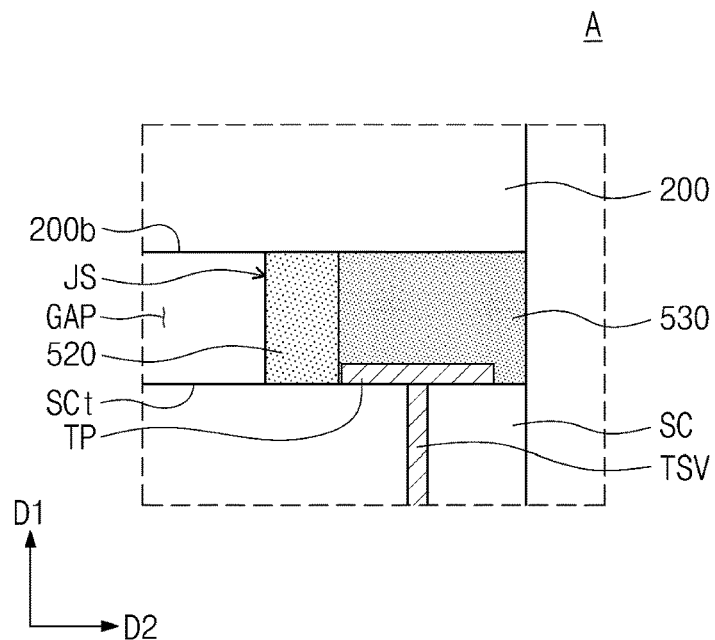

Referring to FIG. 8, the second spacer 520 and the adhesive layer 530 may be provided on the first surface SCt of the image sensor chip SC. The adhesive layer 530 may be attached to an outer side surface of the second spacer 520. The adhesive layer 530 may support the second spacer 520 through the outer side surface of the second spacer 520. The second spacer 520 may not be in contact with the terminal pad TP on the first surface SCt of the image sensor chip SC. The adhesive layer 530 may cover or overlap the terminal pad TP on the first surface SCt of the image sensor chip SC. A width of the adhesive layer 530 in the second direction D2 may be larger than a width of the terminal pad TP in the second direction D2. However, unlike that illustrated in the drawings, the adhesive layer 530 may not cover or overlap a portion of the terminal pad TP, according to some embodiments. In this case, the second spacer 520 may cover or overlap the portion of the terminal pad TP, which is not covered or overlapped with the adhesive layer 530.

Figure 9:
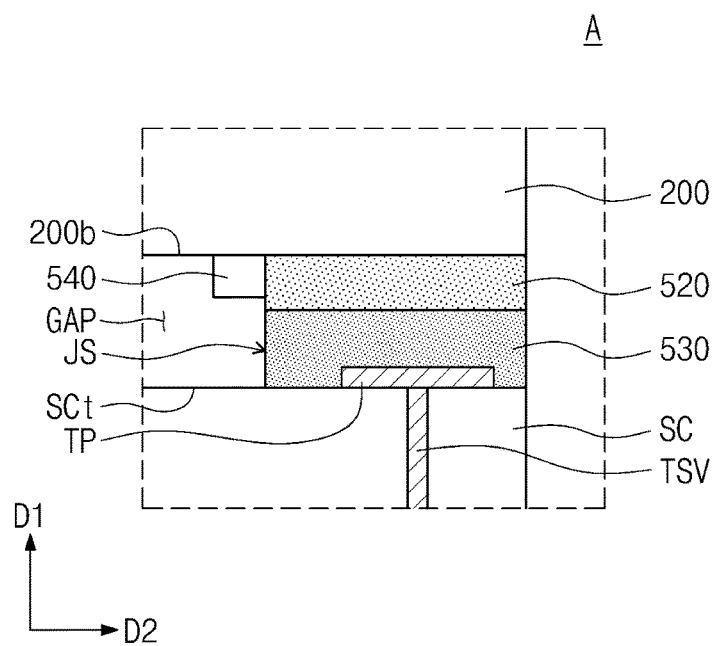

Referring to FIG. 9, the second spacer 520 may be in contact with the bottom surface 200b of the transparent substrate 200. The adhesive layer 530 may be disposed between and attached to the second spacer 520 and the first surface SCt of the image sensor chip SC. The adhesive layer 530 may support the second spacer 520 through the bottom surface of the second spacer 520. The adhesive layer 530 may cover or overlap the terminal pad TP on the first surface SCt of the image sensor chip SC. A width of each of the second spacer 520 and the adhesive layer 530 in the second direction D2 may be larger than a width of the terminal pad TP in the second direction D2. In addition, the joining structure JS may further include a hydrophobic coating material 540. The hydrophobic coating material 540 may be provided to be in contact with a side surface of the second spacer 520.

Figure 10:
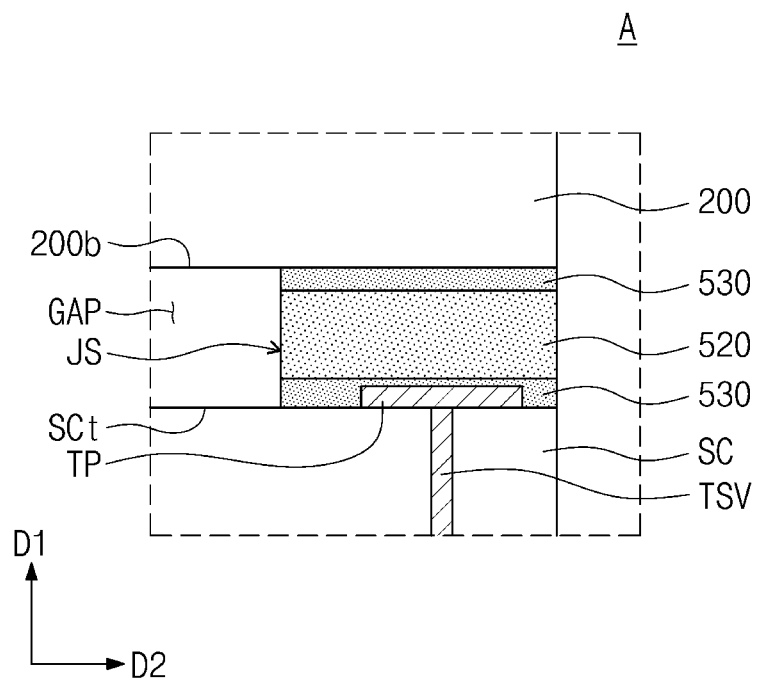

Referring to FIG. 10, the second spacer 520 may be attached to the transparent substrate 200 and the image sensor chip SC by a pair of adhesive layers 530, which are disposed on and under the second spacer 520. The adhesive layers 530 may support the second spacer 520 through the top and bottom surfaces of the second spacer 520. One of the adhesive layers 530 may cover or overlap the terminal pad TP on the first surface SCt of the image sensor chip SC. A width of each of the second spacer 520 and adhesive layers 530 in the second direction D2 may be larger than a width of the terminal pad TP in the second direction D2. However, unlike that illustrated in the drawings, the adhesive layer 530 may not cover or overlap a portion of the terminal pad TP, according to some embodiments. In this case, the second spacer 520 may cover or overlap the portion of the terminal pad TP, which is not covered with the adhesive layer 530.

In the embodiments of FIGS. 8 to 10, the joining structure JS may be formed on the bottom surface 200b of the transparent substrate 200 and then may be attached to the first surface SCt of the image sensor chip SC. In some embodiments, the joining structure JS may be formed on the first surface SCt of the image sensor chip SC and then may be attached to the bottom surface 200b of the transparent substrate 200.

FIGS. 11A to 11D are sectional views illustrating a method of fabricating a joining structure of FIG. 6. Hereinafter, a surface facing the first direction D1 will be referred to as a top surface, and a surface opposite to the top surface will be referred to as a bottom surface.

Figure 11A:
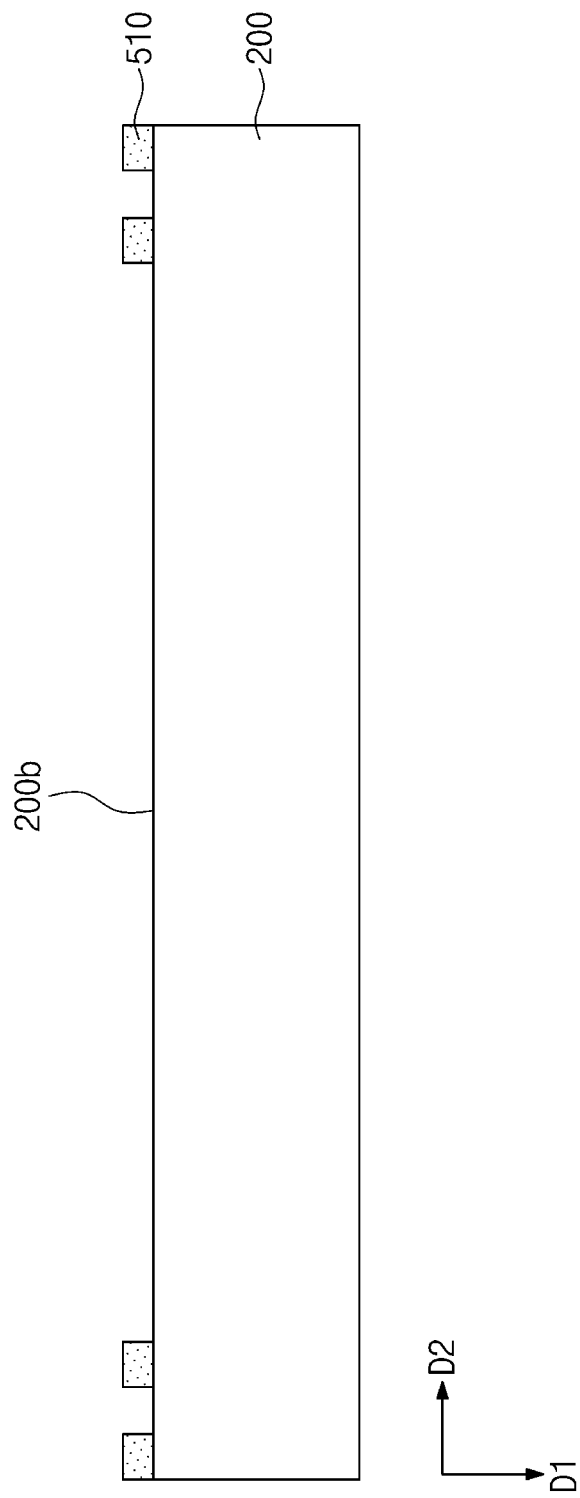
FIGS. 11A to 11D are sectional views illustrating a method of fabricating a joining structure of FIG. 6.

Referring to FIG. 11A, the first spacer 510 may be formed on the bottom surface 200b of the transparent substrate 200. The first spacer 510 may include at least two patterns. The patterns of the first spacer 510 may be spaced apart from each other in the second direction D2. The patterns of the first spacer 510 may be formed by a photo lithography process.

Figure 11B:
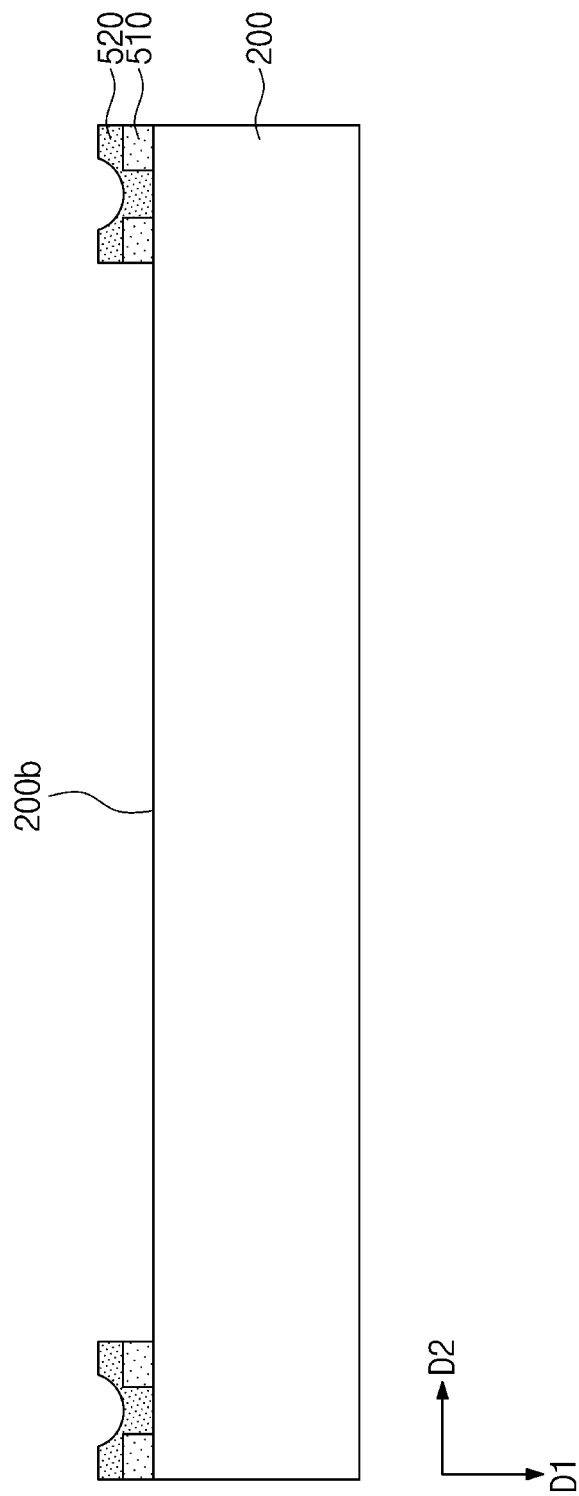

Referring to FIG. 11B, the second spacer 520 may be formed on the bottom surface 200b of the transparent substrate 200 and the patterns of the first spacer 510. The second spacer 520 may be formed to fill a gap region between the patterns of the first spacer 510. The second spacer 520 may be formed by a photo-lithography process. Due to its step-coverage property, the second spacer 520 may be formed such that a portion of a bottom surface thereof has a concave shape.

Figure 11C:
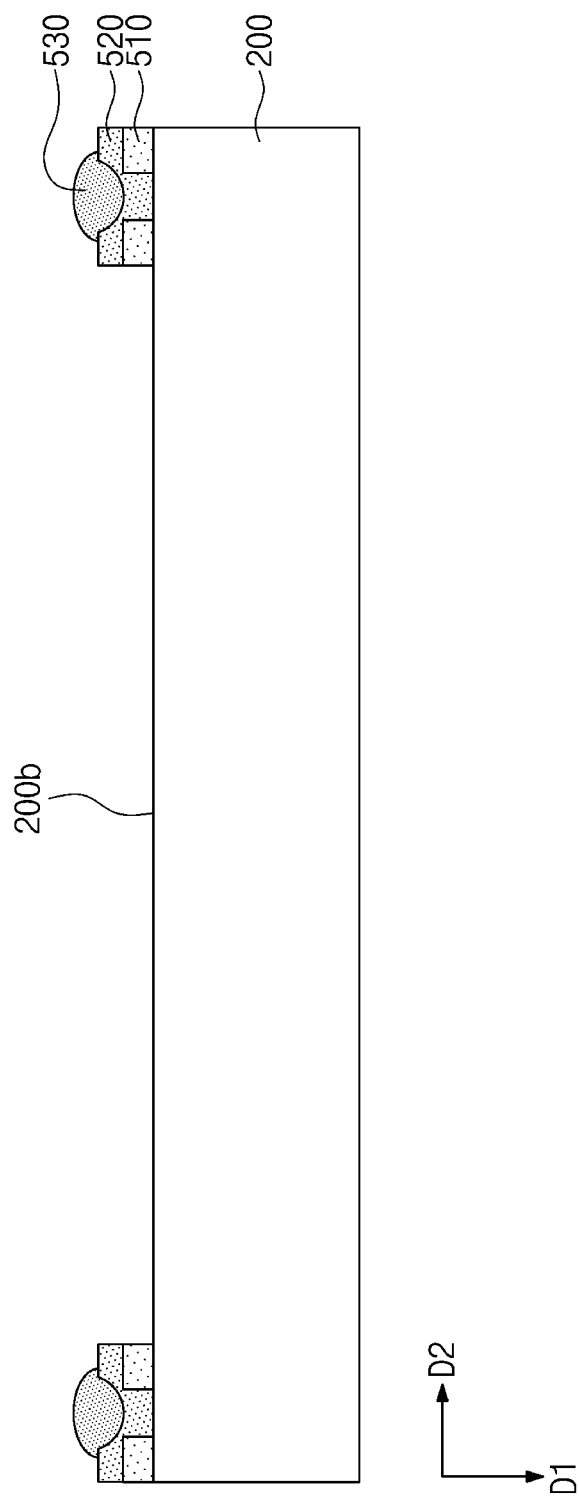

Referring to FIG. 11C, the adhesive layer 530 may be dispensed on the concave bottom surface of the second spacer 520. The adhesive layer 530 may be formed of or include, for example, epoxy resin. The adhesive layer 530 may protrude above the bottom surface of the second spacer 520.

Figure 11D:
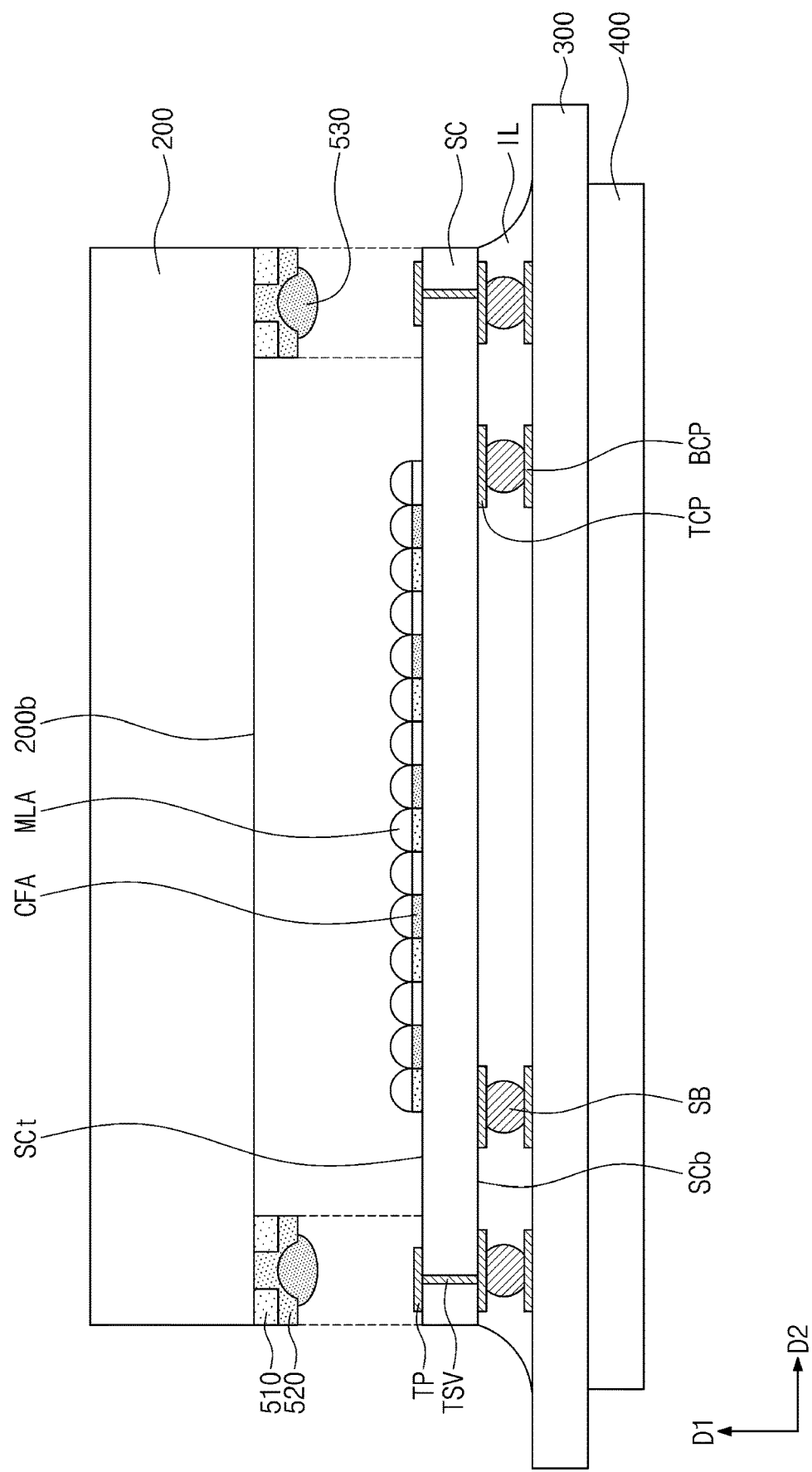

Referring to FIG. 11D, the transparent substrate 200 may be placed such that the bottom surface 200b, on which the first and second spacers 510 and 520 and the adhesive layer 530 are formed, faces the first surface SCt of the image sensor chip SC. Thereafter, the adhesive layer 530 may be attached to an edge region of the image sensor chip SC. The convex bottom surface of the adhesive layer 530 may be deformed, when the adhesive layer 530 covers or overlaps the image sensor chip SC and the terminal pad TP.

Referring back to FIG. 6, the joining structure JS may include the first and second spacers 510 and 520 and the adhesive layer 530. The adhesive layer 530 may cover or overlap the terminal pad TP, between the second spacer 520 and the first surface SCt of the image sensor chip SC.

Figure 12A:
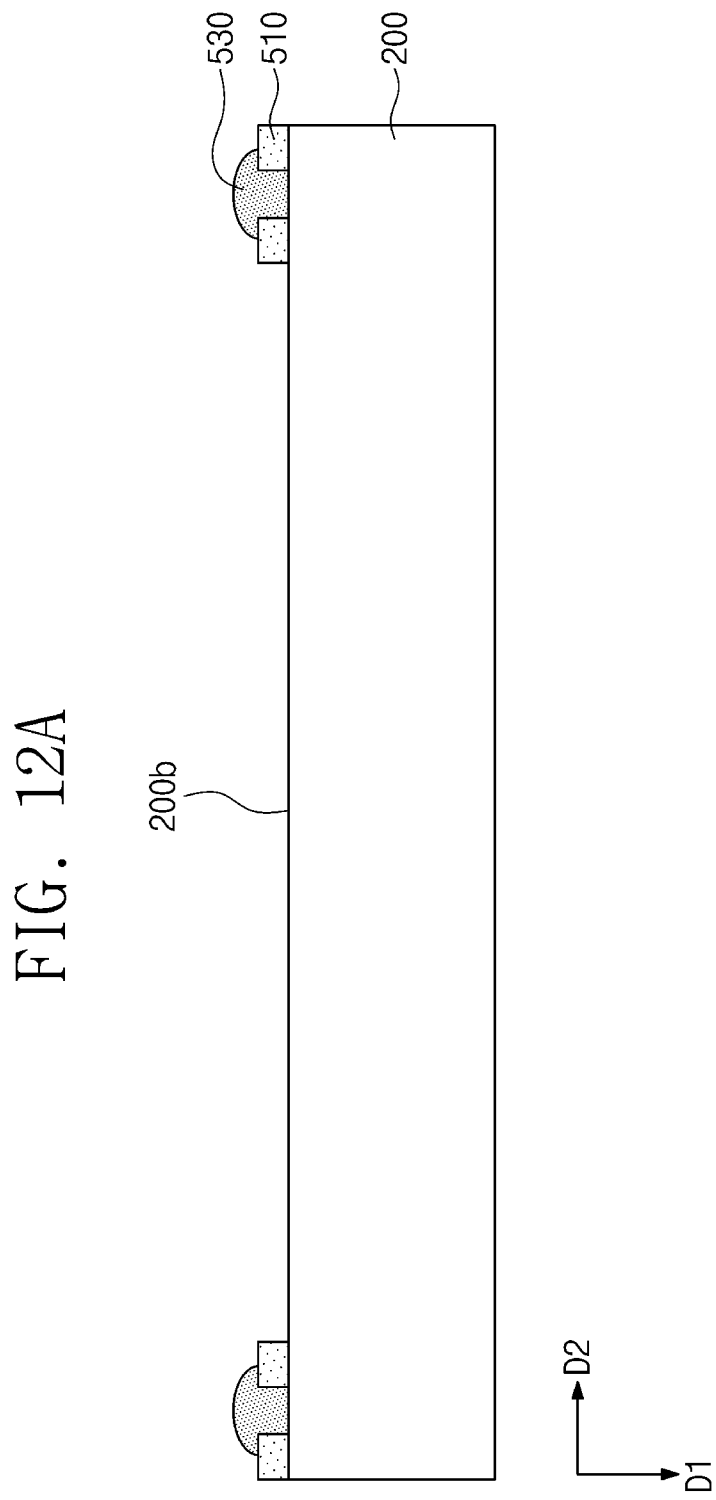
FIGS. 12A and 12B are sectional views illustrating a method of fabricating a joining structure of FIG. 7.
Figure 12B:
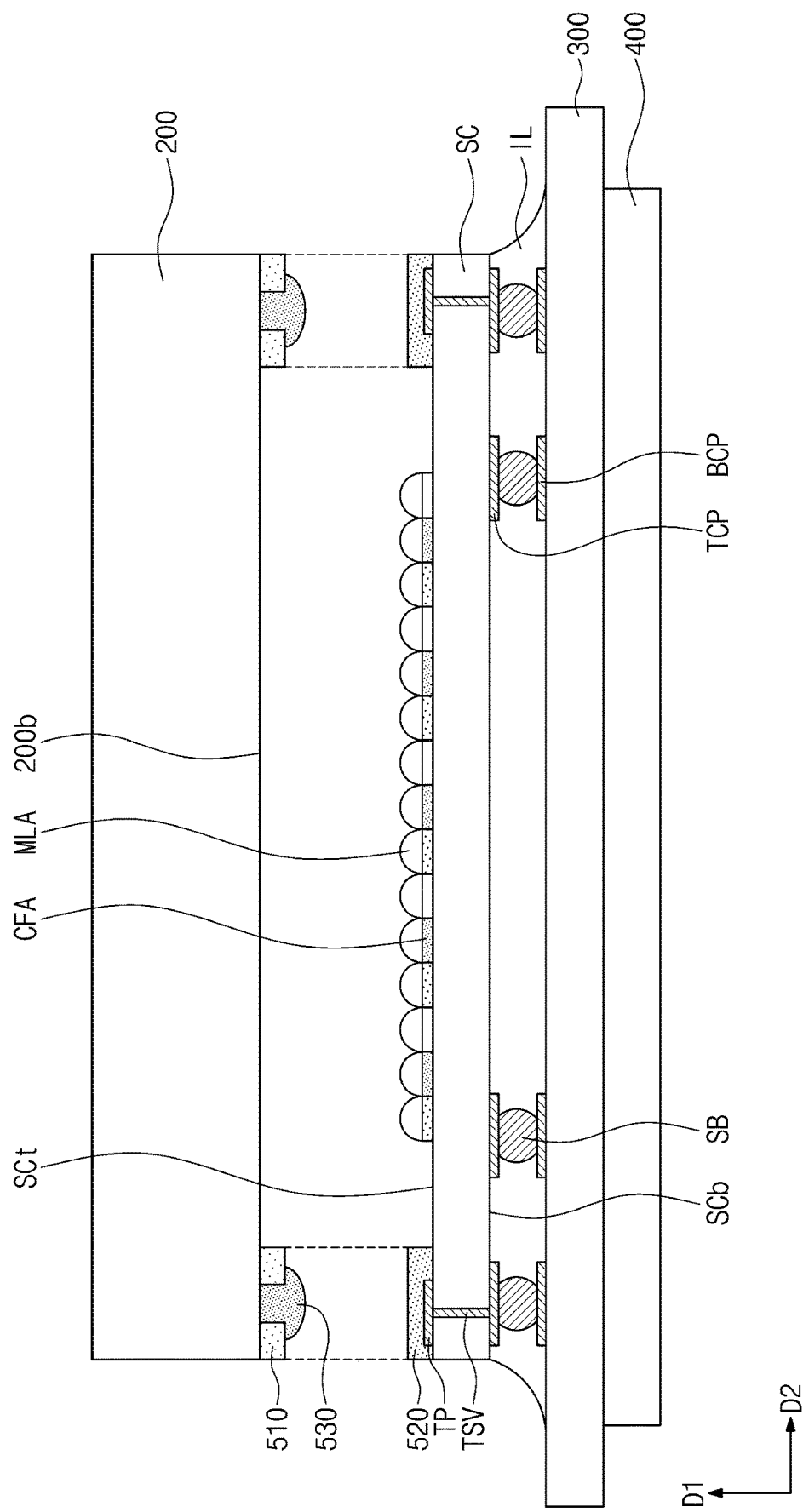

FIGS. 12A and 12B are sectional views illustrating a method of fabricating a joining structure of FIG. 7.

Referring to FIG. 12A, the first spacer 510 may be formed on the bottom surface 200b of the transparent substrate 200 by substantially the same method as that described with reference to FIG. 11A. Thereafter, the adhesive layer 530 may be dispensed in a gap region between the separated patterns of the first spacer 510. The adhesive layer 530 may protrude above the bottom surface of the first spacer 510.

Referring to FIG. 12B, the second spacer 520 may be formed on the first surface SCt of the image sensor chip SC. The second spacer 520 may be formed on an edge region of the image sensor chip SC. The second spacer 520 may be formed to cover or overlap the terminal pad TP. The transparent substrate 200 may be placed such that the bottom surface 200b, on which the first spacer 510 and the adhesive layer 530 are formed, faces the first surface SCt of the image sensor chip SC. Thereafter, the adhesive layer 530 may be attached to the second spacer 520. The convex bottom surface of the adhesive layer 530 may be deformed to a shape parallel to the first surface SCt of the image sensor chip SC.

Referring back to FIG. 7, the joining structure JS may include the first and second spacers 510 and 520 and the adhesive layer 530 therebetween. The adhesive layer 530 may fasten the first and second spacers 510 and 520.

According to some embodiments of the inventive concept, provided is a semiconductor package, in which an image sensor chip and a transparent substrate are in contact with each other in a minimized region or a region that is smaller than conventional methods of forming a semiconductor package, thus making it possible to reduce a size of the semiconductor package.

In addition, the image sensor chip may be connected to a circuit substrate in a flip-chip bonding manner or using through-silicon vias, and thus, it may be possible to reduce resistance and parasitic electrostatic capacitance of the semiconductor package and to improve reliability of the semiconductor package.

While example embodiments of the inventive concepts have been particularly shown and described, it will be understood by one of ordinary skill in the art that variations in form and detail may be made therein without departing from the spirit and scope of the attached claims.

What is claimed is:

1. A semiconductor package, comprising:
   an image sensor chip;
   a transparent substrate spaced apart from the image sensor chip;
   a joining structure in contact with a top surface of the image sensor chip and a bottom surface of the transparent substrate, on an edge region of the top surface of the image sensor chip;
   a micro lens array on the top surface of the image sensor chip;
   a circuit substrate electrically connected to the image sensor chip; and
   a conductive pad and a solder ball between the image sensor chip and the circuit substrate,
   wherein the image sensor chip comprises a penetration electrode, which extends into an internal portion of the image sensor chip, and a terminal pad, which is on the edge region of the top surface of the image sensor chip and is electrically connected to the penetration electrode,
   wherein the solder ball is electrically connected to the penetration electrode and overlaps the penetration electrode in a direction perpendicular to a bottom surface of the transparent substrate,
   wherein the joining structure overlaps the terminal pad,
   wherein the joining structure comprises a first spacer comprising a single layer insulator, a second spacer comprising an insulating material, and an adhesive layer, and
   wherein the first spacer is in direct contact with the bottom surface of the transparent substrate and the second spacer is in direct contact with the terminal pad.

2. The semiconductor package of claim 1,
   wherein the adhesive layer is between the first spacer and the image sensor chip.

3. The semiconductor package of claim 1,
   wherein the second spacer has a concave bottom surface, and
   wherein the adhesive layer is between the concave bottom surface of the second spacer and the terminal pad.

4. The semiconductor package of claim 1,
   wherein the first spacer comprises a plurality of patterns spaced apart from each other, and
   wherein the adhesive layer is between and in contact with the first and second spacers, and
   wherein the adhesive layer at least partially fills a space between the patterns.

5. The semiconductor package of claim 1,
   wherein the first spacer comprises one of polyimide or photoresist, and
   wherein the adhesive layer comprises epoxy resin.

6. The semiconductor package of claim 1, further comprising:
   a color filter array between the micro lens array and the image sensor chip,
   wherein the micro lens array is spaced apart from the bottom surface of the transparent substrate, and
   wherein the micro lens array and the color filter array are spaced apart from the joining structure.

7. The semiconductor package of claim 1, wherein a reinforcing substrate supports the circuit substrate.

8. The semiconductor package of claim 1,
   wherein the conductive pad and the solder ball are spaced apart from an inclined surface of the image sensor chip.

9. The semiconductor package of claim 1, further comprising:
   an insulating layer between the image sensor chip and the circuit substrate; and
   conductive pads, which are respectively on a bottom surface of the image sensor chip and a top surface of the circuit substrate,
   wherein the insulating layer is between and is in contact with ones of the conductive pads, and
   wherein each of the conductive pads is electrically connected to one of a solder ball, a conductive bump, an anisotropic conductive film, or a non-conductive film.

10. The semiconductor package of claim 1,
    wherein a distance between the image sensor chip and the transparent substrate ranges from 10 μm to 150 μm, and
    wherein a width of the joining structure ranges from 30 μm to 450 μm.

11. A semiconductor package, comprising:
    an image sensor chip comprising a pixel region and a peripheral region which encloses the pixel region in a plan view;
    a micro lens and a color filter on the image sensor chip;
    a transparent substrate on the image sensor chip;
    a joining structure in the peripheral region that connects the image sensor chip to the transparent substrate;
    a circuit substrate electrically connected to the image sensor chip;
    an insulating layer between the image sensor chip and the circuit substrate;
    a reinforcing substrate which is in contact with a bottom surface of the circuit substrate and is overlapped with at least the pixel region in a vertical direction that is substantially perpendicular to the image sensor chip; and
    a terminal pad in the peripheral region and on a top surface of the image sensor chip,
    wherein the joining structure comprises a first spacer and an adhesive layer which is between the first spacer and the terminal pad,
    wherein a distance between the joining structure and the micro lens is about 20 μm to 300 μm, wherein a width of the joining structure is from 30 μm to 450 μm, wherein the joining structure comprises the first spacer in direct contact with the bottom surface of the transparent substrate and a second spacer in direct contact with the top surface of the terminal pad, and wherein the second spacer comprises an insulating material, and wherein the first spacer comprises a single layer insulator.

12. The semiconductor package of claim 11, further comprising:
a penetration electrode in the peripheral region that penetrates the image sensor chip and is electrically connected to the terminal pad.

13. The semiconductor package of claim 11, wherein a side surface of the image sensor chip, a side surface of the transparent substrate, and an outer side surface of the joining structure are coplanar with each other.

14. The semiconductor package of claim 11, wherein the joining structure is spaced apart from the pixel region.

15. The semiconductor package of claim 11,
wherein the micro lens is spaced apart from the transparent substrate, the semiconductor package has a cavity between the transparent substrate and the image sensor chip including the micro lens.

16. The semiconductor package of claim 11,
wherein the second spacer has a concave bottom surface, and
wherein the adhesive layer at least partially fills a gap defined by the concave bottom surface of the second spacer.

17. A semiconductor package, comprising:
a transparent substrate comprising an infrared light cut filter;
a circuit substrate spaced apart from the transparent substrate in a first direction perpendicular to a bottom surface of the transparent substrate;
an image sensor chip between the transparent substrate and the circuit substrate, the image sensor chip comprising a micro lens array and a color filter array on a center region of a top surface thereof;
an anisotropic conductive film between the image sensor chip and the circuit substrate, including a plurality of conductive particles and an insulating resin in which the conductive particles are provided;
a terminal pad on an edge region of the top surface of the image sensor chip;
a penetration electrode that extends into the image sensor chip and is electrically connected to the terminal pad;
a connection structure that electrically connects the penetration electrode to the circuit substrate;
a conductive pad and a solder ball between the image sensor chip and the circuit substrate, wherein the solder ball is electrically connected to the penetration electrode and overlaps the penetration electrode in the first direction;
and
a joining structure on the edge region of the top surface of the image sensor chip and in contact with the bottom surface of the transparent substrate and the top surface of the terminal pad,
wherein the joining structure comprises a first spacer comprising a single layer insulator, a second spacer comprising an insulating material, and an adhesive layer which is between the image sensor chip or the transparent substrate and the first spacer,
wherein the first spacer is in direct contact with the bottom surface of the transparent substrate and the second spacer is in direct contact with the top surface of the terminal pad, and
wherein a width of the joining structure in a second direction perpendicular to the first direction is larger than a width of the terminal pad in the second direction.

18. The semiconductor package of claim 17, wherein a side surface of the image sensor chip, a side surface of the transparent substrate, and an outer side surface of the joining structure are coplanar with each other.

19. The semiconductor package of claim 17,
wherein the image sensor chip partially extends in the first direction,
wherein a side portion of the image sensor chip extending in the first direction is inclined at an angle to the top surface of the image sensor chip, and
wherein the circuit substrate is spaced apart from the side portion of the image sensor chip.

20. The semiconductor package of claim 17, wherein a thickness of the circuit substrate is smaller than a thickness of the image sensor chip.

* * * * *